United States Patent
Kamino et al.

(10) Patent No.: US 10,515,777 B2
(45) Date of Patent: Dec. 24, 2019

(54) ION MILLING DEVICE AND PROCESSING METHOD USING THE ION MILLING DEVICE

(71) Applicant: Hitachi High-Technologies Corporation, Minato-ku, Tokyo (JP)

(72) Inventors: Atsushi Kamino, Tokyo (JP); Hisayuki Takasu, Tokyo (JP); Hirobumi Muto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 230 days.

(21) Appl. No.: 14/901,506

(22) PCT Filed: Jul. 11, 2014

(86) PCT No.: PCT/JP2014/068527
§ 371 (c)(1),
(2) Date: Dec. 28, 2015

(87) PCT Pub. No.: WO2015/016039
PCT Pub. Date: Feb. 5, 2015

(65) Prior Publication Data
US 2016/0155602 A1  Jun. 2, 2016

(30) Foreign Application Priority Data
Jul. 29, 2013 (JP) ................. 2013-156256

(51) Int. Cl.
*H01J 37/08* (2006.01)
*H01J 37/16* (2006.01)
(Continued)

(52) U.S. Cl.
CPC .............. *H01J 37/08* (2013.01); *H01J 37/16* (2013.01); *H01J 37/18* (2013.01); *H01J 37/20* (2013.01);
(Continued)

(58) Field of Classification Search
CPC .. H01J 37/08; H01J 37/18; H01J 37/30; H01J 2237/3151; H01J 2237/30; C23C 14/46; C23C 16/481
(Continued)

(56) References Cited

U.S. PATENT DOCUMENTS 6,238,582 B1 * 5/2001 Williams ................. C23F 4/00
216/22
2004/0060900 A1 * 4/2004 Waldhauer ........ H01L 21/30604
216/2
(Continued)

FOREIGN PATENT DOCUMENTS

JP  58-136776 A  8/1983
JP  4-216619 A  8/1992
(Continued)

OTHER PUBLICATIONS

International Search Report (PCT/ISA/210) issued in PCT Application No. PCT/JP2014/068527 dated Oct. 7, 2014 with English translation (Four (4) pages).

*Primary Examiner* — Binh X Tran
(74) *Attorney, Agent, or Firm* — Crowell & Moring LLP

(57) ABSTRACT

This ion milling device is provided with a vacuum chamber (105), an exhaust device (101) for evacuating the interior of the vacuum chamber, a sample stage (103) for supporting a sample (102) to be irradiated inside the vacuum chamber, a heater (107) for heating the interior of the vacuum chamber, a gas source (106) for introducing into the vacuum chamber a gas serving as a heating medium, and a controller (110) for controlling the gas source, the controller controlling the gas source so that the vacuum chamber internal pressure is in a predetermined state during heating by the heater. This enables the control in a short time of the temperature for (Continued)

suppressing condensation, or the like, occurring at atmospheric release after cooling and ion milling a sample.

13 Claims, 2 Drawing Sheets

(51) Int. Cl.
    *H01J 37/18*     (2006.01)
    *H01J 37/20*     (2006.01)
    *H01J 37/305*     (2006.01)

(52) U.S. Cl.
    CPC ..... *H01J 37/3053* (2013.01); *H01J 2237/006* (2013.01); *H01J 2237/06* (2013.01); *H01J 2237/08* (2013.01); *H01J 2237/182* (2013.01); *H01J 2237/184* (2013.01); *H01J 2237/1825* (2013.01); *H01J 2237/2001* (2013.01); *H01J 2237/2002* (2013.01); *H01J 2237/31749* (2013.01)

(58) Field of Classification Search
    USPC ............... 216/66, 67, 71; 156/345.37, 345.4, 156/345.52
    See application file for complete search history.

(56) References Cited

U.S. PATENT DOCUMENTS

| | | | |
|---|---|---|---|
| 2006/0219360 A1* | 10/2006 | Iwasaki | G05D 23/1902 156/345.27 |
| 2011/0031394 A1* | 2/2011 | Knowles | H01J 37/301 250/307 |
| 2013/0075248 A1* | 3/2013 | Hara | C23F 4/02 204/192.34 |
| 2014/0311581 A1* | 10/2014 | Belostotskiy | H01L 21/67253 137/14 |

FOREIGN PATENT DOCUMENTS

| | | |
|---|---|---|
| JP | 5-28943 A | 2/1993 |
| JP | 2010-257856 A | 11/2010 |
| JP | 2012-33335 A | 2/2012 |
| JP | 2012-68227 A | 4/2012 |

\* cited by examiner

ION MILLING DEVICE AND PROCESSING METHOD USING THE ION MILLING DEVICE

TECHNICAL FIELD

The present invention relates to an ion milling device and more specifically relates to an ion milling device including a temperature control mechanism.

BACKGROUND ART

An ion milling device is a device performing thin film processing and cross-section processing of a sample or the like serving as an observation object for a scanning electron microscope or a transmission electron microscope and processes the sample such as a metal, glass, and a ceramic by irradiating the sample with a beam such as argon ion beam. Such processing is performed in a vacuum chamber.

Meanwhile, the temperature of the sample increases by ion beam irradiation. Since the sample may be damaged when the temperature of the sample increases excessively, known is a method for connecting a sample stage to a cooling source such as a Peltier element and cooling the sample to prevent the sample from being damaged, as disclosed in PTL 1. PTL 1 also discloses a method for inverting current to be supplied to the Peltier element to heat the sample in order to suppress frost or condensation occurring at atmospheric release of the vacuum chamber of the ion milling device.

CITATION LIST

Patent Literature

PTL 1: JP 2012-33335 A

SUMMARY OF INVENTION

Technical Problem

Meanwhile, in heating from the Peltier element or the like in PTL 1 serving as a heating source, a heat transmission medium for transmitting heat is required. Since a device, such as the ion milling device, performing beam irradiation while changing an ion beam irradiation angle to the sample, is provided with a tilt stage or the like, a material bent easily such as a metal braided wire must be used for the heat transmission medium to make the heat transmission medium follow movement of the sample stage, and a heat conduction efficiency of the heat transmission medium cannot be increased.

Also, since a part except a contacting part with the heat transmission medium is heated indirectly from the contacting part with the heat transmission medium, it takes considerable time for the heating. Further, in the case of the degree of vacuum in the aforementioned sample chamber (vacuum chamber), heat conduction through the atmosphere in the sample chamber is slight, and heating by a heater with restricted output is required. The output of the heater needs to be restricted in heating because the sample needs to be prevented from being damaged by the heater at the time of heating.

Hereinbelow, an ion milling device aiming at control in a short time of the temperature for suppressing condensation or the like occurring at atmospheric release, and a processing method using the ion milling device, will be described.

Solution to Problem

As an aspect for achieving the object, there is proposed an ion milling device provided with a vacuum chamber, an exhaust device for evacuating an interior of the vacuum chamber, and a sample stage for supporting a sample to be irradiated with an ion beam inside the vacuum chamber, and the ion milling device includes: a heater for heating the interior of the vacuum chamber; a gas source for introducing a gas into the vacuum chamber; and a controller for controlling the gas source, wherein the controller controls the gas source so that vacuum chamber internal pressure is in a predetermined state during heating by the heater.

In addition, there is proposed a processing method using an ion milling device including: after the end of processing by means of the ion milling device, heating an interior of a vacuum chamber in a state in which a vacuum chamber internal pressure of the ion milling device is set to be lower than the atmosphere and higher than that during ion beam processing in the ion milling device.

Advantageous Effects of Invention

According to the above configuration, atmospheric release in a short time can be achieved while suppressing condensation or the like.

DESCRIPTION OF EMBODIMENTS

Figure 1:
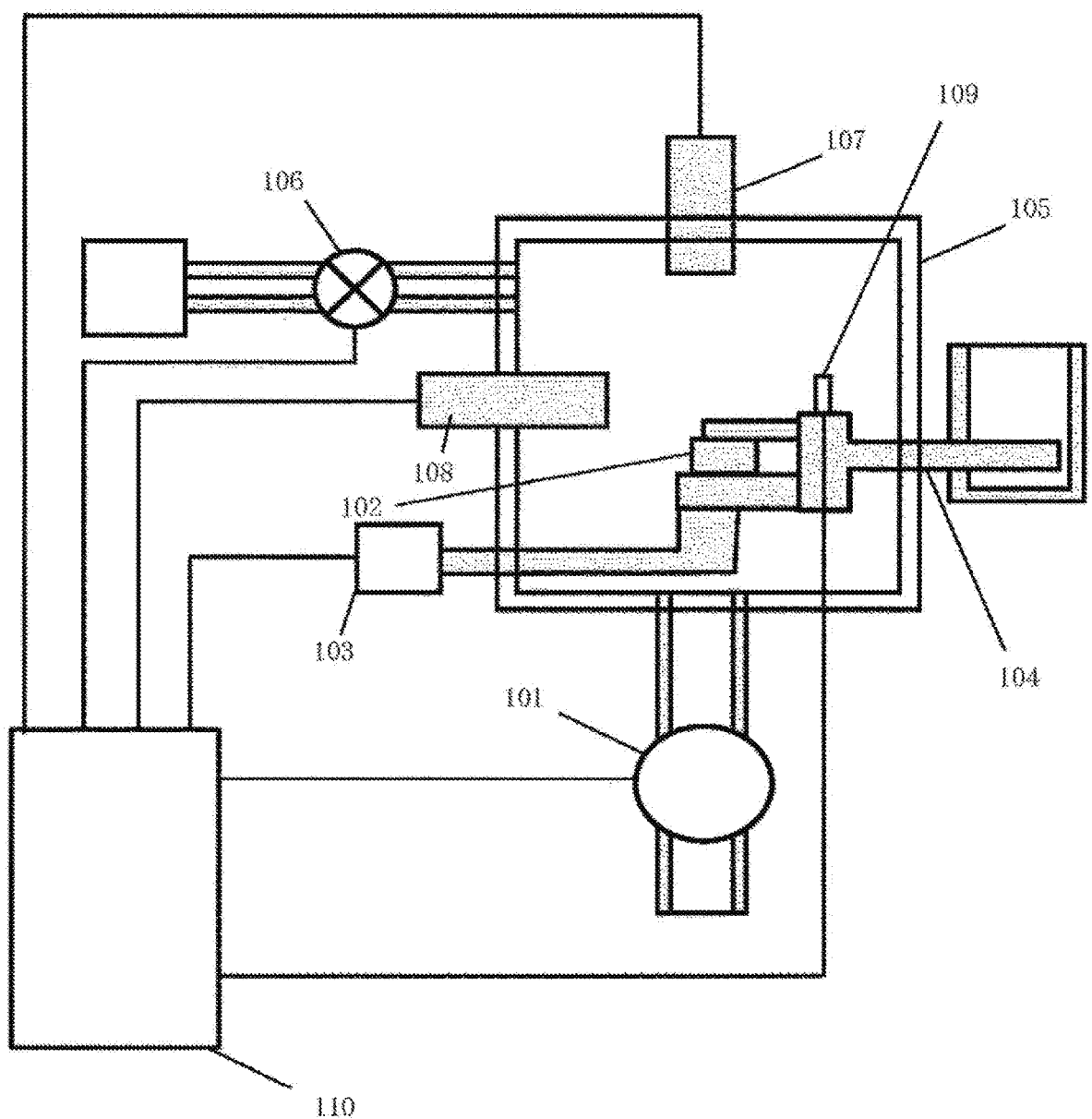
FIG. 1 illustrates an overview of an ion milling device.

In an embodiment is disclosed an ion milling device provided with a vacuum chamber, an exhaust device for evacuating the interior of the vacuum chamber, and a sample stage for supporting a sample to be irradiated with an ion beam inside the vacuum chamber, including a heater for heating the interior of the vacuum chamber, a gas source for introducing a gas into the vacuum chamber, and a controller for controlling the gas source, the controller controlling the gas source so that the vacuum chamber internal pressure is in a predetermined state during heating by the heater.

Also, in disclosure in an embodiment, the controller controls the gas source and the exhaust device so that the vacuum chamber internal pressure is in a predetermined state.

Also, in disclosure in an embodiment, the gas to be introduced from the gas source into the vacuum chamber is a monatomic molecule rare gas.

Also, in disclosure in an embodiment, the ion milling device includes a measuring instrument for measuring the vacuum chamber internal pressure, and the controller controls the gas source so that output of the measuring instrument is in a predetermined condition.

Also, in disclosure in an embodiment, the ion milling device includes a thermometer for measuring the vacuum chamber internal temperature, and the controller controls the gas source until output of the thermometer is in a predetermined condition.

Also, in disclosure in an embodiment, the controller controls the gas source during heating by the heater so that the vacuum chamber internal pressure is 10 E0 Pa to 10 E-1 Pa.

In an embodiment is disclosed a processing method using an ion milling device including, after the end of processing by means of the ion milling device, heating the interior of a vacuum chamber in a state in which the vacuum chamber internal pressure of the ion milling device is set to be lower than the atmosphere and higher than that during the ion beam processing in the ion milling device.

Also, in disclosure in an embodiment, a gas is introduced into the vacuum chamber to set the vacuum chamber internal pressure in a predetermined state during heating the interior of the vacuum chamber.

Also, in disclosure in an embodiment, the interior of the vacuum chamber is evacuated to set the vacuum chamber internal pressure in a predetermined state during heating the interior of the vacuum chamber.

Also, in disclosure in an embodiment, a gas is introduced into the vacuum chamber, and the interior of the vacuum chamber is evacuated, to set the vacuum chamber internal pressure in a predetermined state during heating the interior of the vacuum chamber.

Also, in disclosure in an embodiment, a monatomic molecule rare gas is introduced into the vacuum chamber during heating the interior of the vacuum chamber.

Also, in disclosure in an embodiment, the vacuum chamber internal pressure is set in a predetermined state until the vacuum chamber internal temperature is in a predetermined condition.

The following description relates to an ion milling device equipped with a sample cooling function, and more specifically relates to a charged-particle beam irradiation device including a sample serving as a target for ion beam irradiation, a sample stage for mounting the sample thereon, a sample holder for installing the sample stage thereon, or a cooling mechanism for cooling the sample indirectly from a cooling source via a driving mechanism for driving the sample holder.

In the ion milling device, for the purpose of prevention or reduction of a temperature increase of a sample which is easily subject to a damage, such as deformation when the temperature of the surface of the sample rises over a melting point of the sample composition due to the temperature increase of the sample by ion beam irradiation to cause the sample to be melted (hereinbelow simply referred to as a beam damage), there is a method for cooling the sample indirectly via a sample stage with use of heat conduction of a metal braided wire or the like, using liquid nitrogen as a cooling source, a method for cooling the sample by pouring the liquid nitrogen into the sample stage, or a method for cooling the sample with a Peltier element.

Meanwhile, when the sample which has been cooled during ion beam irradiation is taken out of a vacuum chamber after the end of ion milling processing or ion beam irradiation processing, the sample is desirably heated to a dew point or higher by installing a heating means such as a heater in a cooling transmission means or an independent heating means in order to prevent condensation (frost) from occurring on the sample and the cooling transmission means.

Meanwhile, during the ion beam irradiation, a main exhaust device (generally including a roughing pump such as a triscroll pump, a rotary pump, and a diaphragm pump, and a turbo-molecular pump or the like) is continuously operated to keep pressure in a sample chamber (vacuum chamber) to pressure from $10^{-2}$ Pa to $10^{-4}$ Pa (10 E-2 Pa to 10 E-4 Pa).

Also, in the ion milling device, to change an ion beam irradiation angle to the sample at all times, the sample (the sample stage) needs to be turned continuously at predetermined angles within about ±40 degrees. Thus, for the "cooling transmission means," a copper braided wire, which can be bent, or the like, is used. Since this braided wire has a low heat transmission efficiency, it takes about one hour to cool the sample to a predetermined temperature (about −100° C.) in a case in which liquid nitrogen is used as a cooling source, for example. In addition, when the sample is taken out after the end of the ion milling processing, the temperature needs to be raised to a temperature at which the sample, the sample stage, a shielding plate, and the cooling means are not subject to condensation (frost). The temperature is about a temperature 7° C. lower than a room temperature or higher, and to reach the temperature, it takes about one to two hours or more.

In the present embodiment, a method and a device for heating a sample in a short time while suppressing condensation (frost) occurring when the sample which has been cooled is taken out of a vacuum chamber after the end of ion beam irradiation processing will be described.

In the following embodiment, in order to heat the sample or a sample holder to a temperature at which condensation (frost) does not occur in a short time with a relatively simple configuration, a vacuum exhaust system (an exhaust means) is controlled so that the vacuum pressure in the vacuum chamber during the ion beam irradiation is about $10^{-2}$ Pa to $10^{-4}$ Pa (10 E-2 Pa to 10 E-4 Pa) or less, and when the sample is taken out, a main exhaust means is stopped, and a sub exhaust means is controlled so that the pressure is higher than that during the ion beam irradiation, to keep $10^{-0}$ Pa to $10^{-1}$ Pa (10 E0 Pa to 10 E-1 Pa), for example.

In addition, in such a pressure state, or to bring such a pressure state, a monatomic molecule gas which is highly pure or dry by removing moisture, or more specifically, argon gas, neon gas, or helium gas, which is a rare gas, is introduced into a vacuum container (vacuum chamber).

By introducing the gas into the vacuum chamber, the gas molecules freely move in the vacuum chamber and collide with the wall and the like, and these colliding gas molecules act as heat media. The freely-moving gas molecules act as the heat media in this manner to cause an efficiency of heat release (heat conduction) from the surface of the sample or the sample holder serving as a heating target to be much higher than that in a vacuum atmosphere of about $10^{-3}$ Pa to $10^{-4}$ Pa (10 E-3 Pa to 10 E-4 Pa). When a heater, a lamp, or the like is installed in the vacuum chamber in this state, convection in the atmosphere in the vacuum chamber can be utilized actively in heat transmission, and the temperature of the sample or the sample holder can be raised to a target temperature in a short time.

Also, since an increase of the sample surface temperature can be expected due to heat conduction caused by contact of the gas with the sample surface, a transmission efficiency of the heater output can be higher than that in a case of heating in the controlled vacuum atmosphere of about $10^{-3}$ Pa to $10^{-4}$ Pa (10 E-3 Pa to 10 E-4 Pa). Accordingly, heating time until the sample holder is taken out can be shortened to about 20% or shorter.

Further, since the gas molecules can reach a part that a heat transmission medium such as a braided wire does not contact, the temperature in the entire vacuum chamber can be controlled, and consequently, time to reach a predetermined temperature can be shortened drastically. In other words, by introducing a single-atom (monatomic molecule) rare gas such as argon gas, neon gas, and helium gas into a vacuum chamber and using such a high-purity gas as a heat transmission medium, the entire vacuum chamber can be heated, and a heating target can be heated uniformly. Accordingly, time to reach a temperature at which a sample, a sample stage, a shielding plate, and a cooling means are not subject to condensation (frost), that is, about a temperature 7° C. lower than a room temperature or higher, can be shortened.

FIG. 1 illustrates an overview of an ion milling device.

The ion milling device illustrated in FIG. 1 includes an exhaust means 101 (a vacuum pump, a leak valve, or the like) for evacuating a vacuum chamber 105 or releasing the vacuum chamber 105 to the atmosphere, a sample stage 103 for mounting a sample 102 for ion milling processing, a cooling mechanism 104 for cooling the sample, a gas supply mechanism 106 (a gas source) for introducing a gas into the vacuum chamber 105, a heater 107 serving as a heat source, and a measuring instrument 108 for measuring vacuum pressure in the vacuum chamber 105.

The ion milling device also includes a thermometer 109 for measuring the temperature in the vacuum chamber 105 and a controller 110 for controlling respective components of the aforementioned ion milling device based on measurement results and the like of the measuring instrument 108 and the thermometer 109.

In the present embodiment, the sample 102 is cooled by the cooling mechanism 104 to restrict a damage of the sample 102 during ion beam irradiation, and temperature increase control in the vacuum chamber 105 is executed after the ion beam irradiation and before atmospheric release. More specifically, after the ion beam irradiation, a monatomic molecule rare gas such as argon gas, neon gas, and helium gas is introduced from the gas supply mechanism 106 installed in the vacuum chamber 105. At this time, heating of the interior of the vacuum chamber 105 by the heater 107 (heater) is executed while the gas supply mechanism 106 and/or the exhaust mechanism 101 are/is controlled so that the pressure in the vacuum chamber 105 is $10^{-0}$ Pa to $10^{-1}$ Pa (10 E0 Pa to 10 E-1 Pa). Since the supplied gas molecules exist in the vacuum chamber 105, heat of the heater 107 can heat the respective components (the sample, the sample stage, a shielding plate, the cooling mechanism, and the like) of the ion milling device in the vacuum container 105 via the gas molecules. Also, since a certain degree of vacuum state is secured, the temperature can be raised to a temperature 7° C. lower than a room temperature or higher, at which no condensation occurs, in a state in which no condensation occurs in the vacuum container 105.

Figure 2:
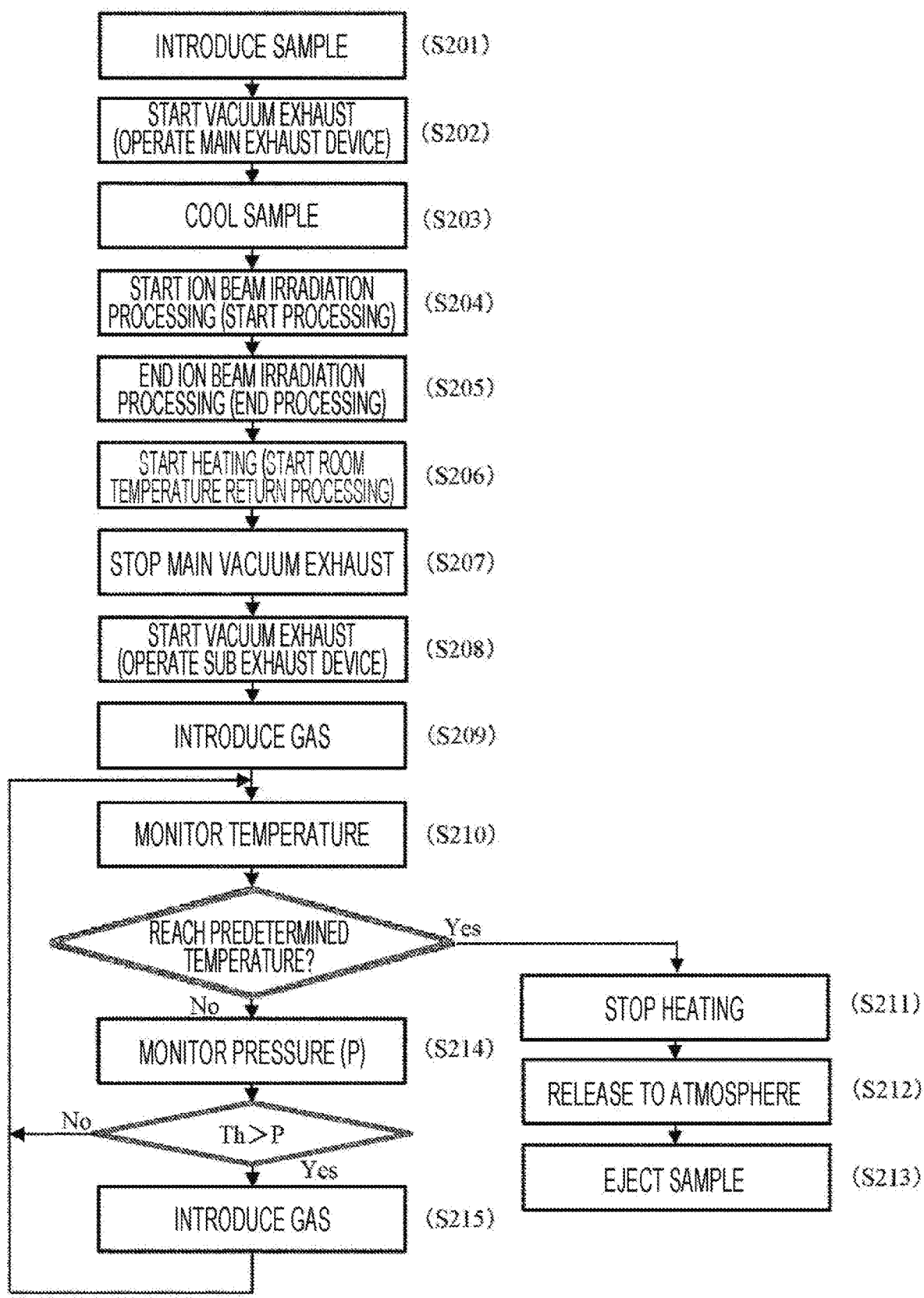
FIG. 2 is a flowchart illustrating processes from introduction of a sample into the ion milling device to ejection of the sample.

FIG. 2 is a flowchart illustrating processes from introduction of the sample into the ion milling device to ejection of the processed sample. First, the sample 102 serving as a processing target of the ion milling device is introduced into the vacuum chamber 105 (step 201). Subsequently, the controller 110 controls the exhaust mechanism 101 to perform vacuum exhaust until the atmosphere in the vacuum chamber 105 reaches predetermined pressure while monitoring output of the measuring instrument 108 (step 202). Subsequently, the sample 102 in the vacuum chamber 105 reaching the predetermined pressure is cooled with use of the cooling mechanism 104 (step 203). Thereafter, sample processing by ion beam irradiation is performed, and when desired processing is finished, the ion beam irradiation ends (steps 204 and 205).

After the end of the sample processing, the controller 110 executes sample heating processing for suppressing condensation at atmospheric release. First, the heater 107 is powered on to start heating (step 206). However, since heat conductivity is extremely low in a vacuum, the sample 102 and the like arranged at positions away from the heater 107 with the vacuum space interposed therebetween cannot be heated. To solve the problem, a heat transmission medium is supplied into the vacuum chamber 105.

First, main vacuum exhaust is stopped, and a sub exhaust device is operated (steps 207 and 208). It is to be noted that, in a case in which the main vacuum exhaust and the sub exhaust stated here are performed, two vacuum exhaust systems having different abilities may be prepared and used by switching them, or vacuum states may be switched by control of one vacuum exhaust system, for example. When the sub exhaust is performed, vacuum exhaust in the vacuum chamber 105 is executed so that the pressure is higher than the pressure during the main vacuum exhaust. Subsequently, a gas serving as the heat transmission medium is introduced from the gas supply mechanism 106 (step 209). By bringing such a state, the gas molecules intervene between the targets (the sample, the shielding plate, and the like) cooled by the cooling mechanism 104 and the heater 107, and heating of the sample and the like can be accelerated.

The controller 110 performs heating control in this manner and stops heating (step 211) when a result of temperature monitoring (step 210) with use of the thermometer 109 reaches a predetermined temperature (e.g., a temperature 7° C. lower than a room temperature). It is to be noted that heating may be stopped when the vacuum chamber 105 becomes in the atmospheric state. The vacuum chamber 105 is released to the atmosphere (step 212) when the vacuum chamber 105 becomes in the atmospheric state, and the sample is ejected (step 213).

Meanwhile, in a case in which the result of the temperature monitoring in step 210 does not satisfy a predetermined condition, the controller 110 continues heating by the heater 107 and monitors the pressure (step 214) in the vacuum chamber 105 by the measuring instrument 108, and when pressure P falls below a predetermined value (Th), the controller 110 takes control so that a gas is reintroduced (step 215). Such processing is continued until the predetermined temperature condition is satisfied. According to such control, heating can be continued while keeping the atmosphere in the vacuum chamber 105 in a state of high heat conductivity. Meanwhile, in the present embodiment, since vacuuming by the sub exhaust device is continued, control is taken so that the pressure in the vacuum chamber 105 is predetermined pressure by control of the gas supply mechanism 106 serving as the gas source. However, control may be taken so that the pressure in the vacuum chamber 105 is predetermined pressure during heating by switching control between the sub exhaust device and the gas supply mechanism 106. For example, when the pressure in the vacuum chamber 105 exceeds a predetermined value (Thh), vacuum exhaust by the sub exhaust device may be executed, and when the pressure in the vacuum chamber 105 falls below the predetermined value (Thl (<Thh)), gas introduction may be performed.

The overall control method enabling heating by the heater to be performed in a state in which the gas is supplied into the vacuum chamber 105 while keeping the pressure in the vacuum chamber 105 in a predetermined state can be applied, and such a configuration enables heating to a temperature state that does not generate condensation to be performed in a short time.

REFERENCE SIGNS LIST 101 exhaust mechanism
102 sample
103 sample stage
104 cooling mechanism
105 vacuum chamber
106 gas supply mechanism
107 heater
108 measuring instrument
109 thermometer
110 controller

The invention claimed is:

1. An ion milling device provided with a vacuum chamber, an exhaust device for evacuating an interior of the vacuum chamber, and a sample stage for supporting a sample to be irradiated with an ion beam inside the vacuum chamber, comprising:
   a heater for heating the interior of the vacuum chamber through gas;
   a gas source for introducing a gas into the vacuum chamber; and
   a controller receiving input information on a vacuum pressure in the vacuum chamber and on a temperature in the vacuum chamber for controlling the gas source,
   wherein the controller controls the heater and the gas source so that vacuum chamber internal pressure is in a predetermined state and a vacuum chamber internal temperature is sufficient to avoid condensation within the vacuum chamber, with said vacuum chamber internal pressure below atmospheric pressure and above a pressure during irradiating with the ion beam, during heating by the heater.

2. The ion milling device according to claim 1, wherein the controller controls the gas source and the exhaust device so that the vacuum chamber internal pressure is in the predetermined state.

3. The ion milling device according to claim 1, wherein the gas to be introduced from the gas source into the vacuum chamber is a monatomic molecule rare gas.

4. The ion milling device according to claim 1, further comprising:
   a measuring instrument for measuring the vacuum chamber internal pressure,
   wherein the controller controls the gas source so that output of the measuring instrument is in a predetermined condition.

5. The ion milling device according to claim 1, further comprising:
   a thermometer for measuring the vacuum chamber internal temperature,
   wherein the controller controls the gas source until output of the thermometer indicates that the temperature is sufficient to avoid the condensation.

6. The ion milling device according to claim 1, wherein the controller controls the gas source during heating by the heater so that the vacuum chamber internal pressure is 10E0 Pa to 10E-1 Pa.

7. The ion milling device according to claim 1, wherein the sample stage is separated from the heater.

8. A processing method using the ion milling device according to claim 1, comprising:
   conducting ion beam irradiation processing by the ion milling device; and
   after ion beam irradiation processing by the ion milling device, heating the interior of the vacuum chamber in a state in which the vacuum chamber internal pressure of the ion milling device is set in the predetermined state, with the vacuum chamber internal pressure lower than the atmosphere and higher than the pressure during the ion beam irradiation processing by the ion milling device.

9. The processing method using the ion milling device according to claim 8, wherein the gas is introduced into the vacuum chamber to set the vacuum chamber internal pressure in the predetermined state during heating the interior of the vacuum chamber.

10. The processing method using the ion milling device according to claim 8, wherein the interior of the vacuum chamber is evacuated to set the vacuum chamber internal pressure in the predetermined state during heating the interior of the vacuum chamber.

11. The processing method using the ion milling device according to claim 8, wherein the gas is introduced into the vacuum chamber, and the interior of the vacuum chamber is evacuated, to set the vacuum chamber internal pressure in the predetermined state during heating the interior of the vacuum chamber.

12. The processing method using the ion milling device according to claim 8, wherein a monatomic molecule rare gas is introduced into the vacuum chamber during heating the interior of the vacuum chamber.

13. The processing method using the ion milling device according to claim 8, wherein the vacuum chamber internal pressure is set in the predetermined state until the vacuum chamber internal temperature is sufficient to avoid the condensation.

* * * * *